United States Patent [19]
Gleason et al.

[11] Patent Number: 5,157,559
[45] Date of Patent: Oct. 20, 1992

[54] ADJUSTABLE BANDWIDTH DIFFERENTIATING AMPLIFIER FOR A MAGNETIC DISK DRIVE

[75] Inventors: Jefferey A. Gleason, Minneapolis; David E. Sutliff, Eagan, both of Minn.

[73] Assignee: VTC Inc., Bloomington, Minn.

[21] Appl. No.: 742,055

[22] Filed: Aug. 6, 1991

Related U.S. Application Data

[63] Continuation of Ser. No. 344,166, Apr. 26, 1989, abandoned.

[51] Int. Cl.$^5$ .................. G11B 5/09; G11B 5/035; G11B 5/02
[52] U.S. Cl. ........................ 360/46; 360/65; 360/67
[58] Field of Search ............ 360/46, 65, 67, 68; 307/296.1, 355, 494; 330/305, 306

[56] References Cited

U.S. PATENT DOCUMENTS

| | | | |
|---|---|---|---|
| 4,306,198 | 12/1981 | Okada | 330/260 |
| 4,514,704 | 4/1985 | Curtis | 330/305 |
| 4,564,869 | 1/1986 | Baumeister | 360/46 |
| 4,575,687 | 3/1986 | Moore, Jr. | 330/261 |
| 4,722,010 | 1/1986 | Suzuki et al. | 360/46 |
| 4,772,964 | 9/1988 | Kaida | 360/46 |
| 4,945,311 | 7/1990 | Smith | 328/167 |

OTHER PUBLICATIONS

Gray et al., Analog Integrated Circuits 2nd Ed., 1984, p. 597.

Primary Examiner—Andrew L. Sniezek
Assistant Examiner—Won Tae C. Kim
Attorney, Agent, or Firm—Kinney & Lange

[57] ABSTRACT

A variable bandwidth differentiating amplifier comprises a differential amplifier and a variable filter comprising a capacitor and a pair of diodes. A current source, having a current value derived from the track postion information in the track count register of a disk drive forward biases the diodes to alter the frequency response of the filter. A Gilbert multiplier may also be included to maintain a constant voltage gain for the differential amplifier.

14 Claims, 3 Drawing Sheets

ADJUSTABLE BANDWIDTH DIFFERENTIATING AMPLIFIER FOR A MAGNETIC DISK DRIVE

This is a continuation of application Ser. No. 07/344,166, filed Apr. 26, 1989 (now abandoned).

This invention relates to a read circuit for a magnetic disk drive, and particularly to a differentiating amplifier with a variable bandwidth for reading digital information from a magnetic disk.

In certain types of magnetic recording, digital information is recorded at different frequencies, depending upon the position of the concentric track on the disk. For example, employing a technique called "zone-bit recording", information on different tracks are recorded at different frequencies. In the recovery of signals from such magnetic disks, it is necessary to employ a differential amplifier having a bandwidth capable of receiving and detecting the frequency of the data. The frequency varies from track to track, and as much as two times over the radius of the disk. The bandwidth of the differential amplifier must be reasonably wide as to accommodate all frequencies of the recorded information across the disk.

While wide bandwidth differentiating amplifiers are known, it is also known that such differentiating amplifiers have relatively poor signal recovery characteristics, as compared to differentiating amplifiers with more narrow bandwidths. Therefore, it is desirable that a differentiating amplifier for the read circuits of a magnetic disk drive have as small as possible a bandwidth. However, to accommodate zone-bit recording, and other variable frequency recording techniques, it is desirable that the bandwidth of the differentiating amplifier be adjustable in accordance with track position. The present invention, therefore, is directed to an adjustable bandwidth differentiating amplifier for the signal recovery circuits of a magnetic disk drive.

U.S. Pat. No. 4,722,010 to Suzuki describes a differentiating amplifier having a bandwidth which varies in accordance with the track position of a magnetic disk drive. Particularly, Suzuki employs an LRC filter for establishing bandwidth of the differentiating amplifier, with portions the resistor being switchable into and out of the circuit in accordance with the count in a track counter. More particularly, Suzuki employs two discrete bandwidths for the differentiating amplifier, the selection of the bandwidth being determined by the count in the track counter. While the Suzuki approach lessens the criticality of the bandwidth adjustment, it nevertheless does not solve the problem. The present invention is directed at a differentiating amplifier with an adjustable bandwidth wherein the bandwidth is continuously adjusted over the entire range of the tracks in accordance with the register containing the track count. Hence, the bandwidth is finely "tuned" to the bandwidth associated with each track of the magnetic disk.

In accordance with the present invention, a differentiating amplifier is provided with a filter comprising a reactive device, such as a capacitor, and a semiconductor device, such as a diode. A register, containing the count indicative of the track position of the read head of the disk drive, operates a current driver to supply a current to forward bias the diode. The resistance of the diode is altered in accordance with the current supplied by the track register to thereby alter the RC network of the filter to adjust the bandwidth in accordance with the particular track being read.

One feature of the present invention resides in the fact that the bandwidth is continuously adjustable in accordance with the track position of the head.

The above and other features of this invention will be more fully understood from the following detailed description, and the accompanying drawings, in which.

Figure 1:
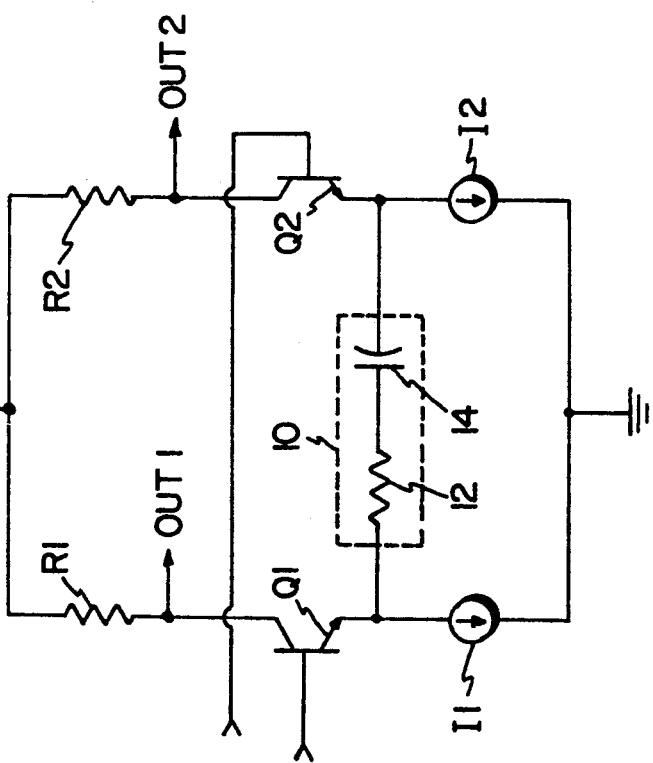
FIG. 1 is a circuit diagram of a differentiating amplifier used in prior magnetic disk drives for recovery of read signals.

Referring to FIG. 1, there is illustrated a differentiating amplifier as used in prior magnetic disk drives. Differentiating amplifier comprises a pair of opposing NPN transistors Q1 and Q2, arranged in a differential amplifier each having their collectors connected through resistors R1 and R2 to a voltage supply Vcc. The collectors are also connected to the differential outputs, output 1 and output 2. The emitters of transistors Q1 and Q2 are connected through respective current sources I1 and I2 to a common ground, and a filter 10 is connected between the emitters of the transistors Q1 and Q2. The filter comprises, in this case, an RC network comprising resistor 12 and capacitor 14. The purpose of the filter is to tune the bandwidth of the differentiating amplifier to the desired frequency, as is well known in the art. Input from the read head (not shown) is provided to the bases of transistors Q1 and Q2.

Figure 2:
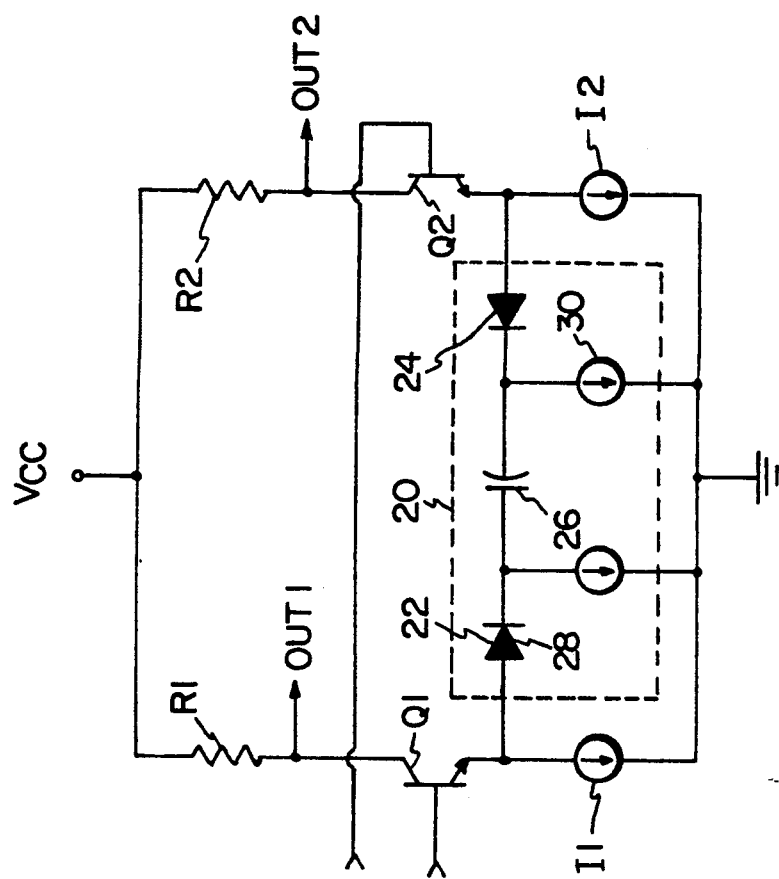
FIG. 2 is a circuit diagram of an adjustable band width differentiating amplifier in accordance with the presently preferred embodiment of the present invention.

FIG. 2 illustrates a differentiating amplifier in accordance with the presently preferred embodiment of the present invention. The principal difference between FIGS. 1 and 2 lies in the filter network of providing an adjustable bandwidth for the differentiating amplifier. Thus, the amplifier illustrated in FIG. 2 comprises a pair of NPN transistors Q1 and Q2 each receiving an input, as from the coils of a magnetic head (not shown) and each having their collectors connected to a respective output, output 1 and output 2. The collectors are also connected through resistors R1 and R2 to a source Vcc. The emitters of transistors Q1 and Q2 are connected through current sources I1 and I2 to ground. Filter 20 is connected between the emitters of transistors Q1 and Q2 to establish the bandwidth of the differential amplifier. In this case, the filter comprises a pair of diodes 22 and 24, having their cathodes connected to a capacitor 26. The anode of diode 22 is connected to the junction between the emitter of transistor Q1 and the current source I1 and the anode of diode 24 is connected to the junction between the emitter of transistor Q2 and the current source I2. Current sources 28 and 30 are connected between ground and the cathodes of diodes 22 and 24 on each side of capacitor 26. Current source 28 is arranged to forward bias diode 22 and current source 30 is connected to forward bias diode 24. Current sources 28 and 30 are equal to each other, and are small compared to current sources I1 and I2.

It can be shown that the effective impedance of the forward biased diode 22 or 24 is directly proportional to the thermal voltage (Vt) across the diode and inversely proportional to the current (Id) through it. It can further be shown that the current through either diode 22 or 24 is equal to the current of the current source 28 or 30. Hence, the bandwidth at 3 dB can be represented by the following pole equation:

$$P = \frac{Id}{4\pi V t C}$$

where C is the capacitance of capacitor 26.

Figure 3:
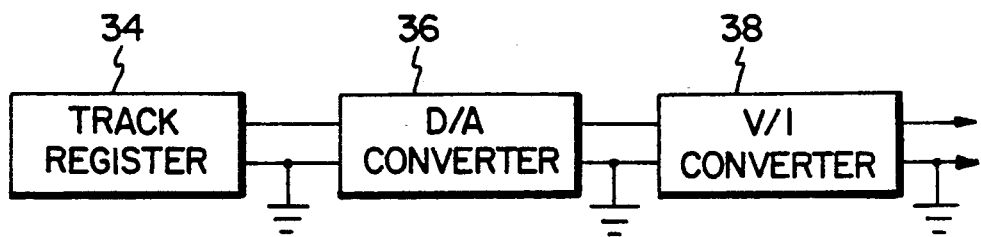
FIG. 3 is a block diagram of the apparatus used to achieve the current source for the apparatus of FIGS. 2, 4 and 5.

FIG. 3 illustrates a block diagram of the apparatus for generating the current sources 28 and 30 in FIG. 2. Track register 34 associated with the magnetic disk drive contains a digital count of the track from which the magnetic head of the disk drive is reading. The track count register such as register 34 is well known in the art and need not be further explained. For purposes of the present invention, however, the digital count from register 34 is provided to a digital-to-analog converter 36 to provide an analog signal to voltage-to-current converter 38. Hence, converter 36 provides an analog voltage representative of the count in register 34 to converter 38 which, in turn, converts the analog voltage to a current source for application as current sources 28 and 30 in FIG. 2.

In operation of the apparatus illustrated in FIG. 2 and FIG. 3, as the magnetic head moves from track to track across the disk, the count in track register 34 changes, thereby altering the analog voltage signal from converter 36. As a result, the current source provided by converter 38 is likewise altered to alter the current Id through the diodes 22 and 24. As a result, the bandwidth of the differentiating amplifier is constantly changed in accordance with the count in register 34.

Figure 4:
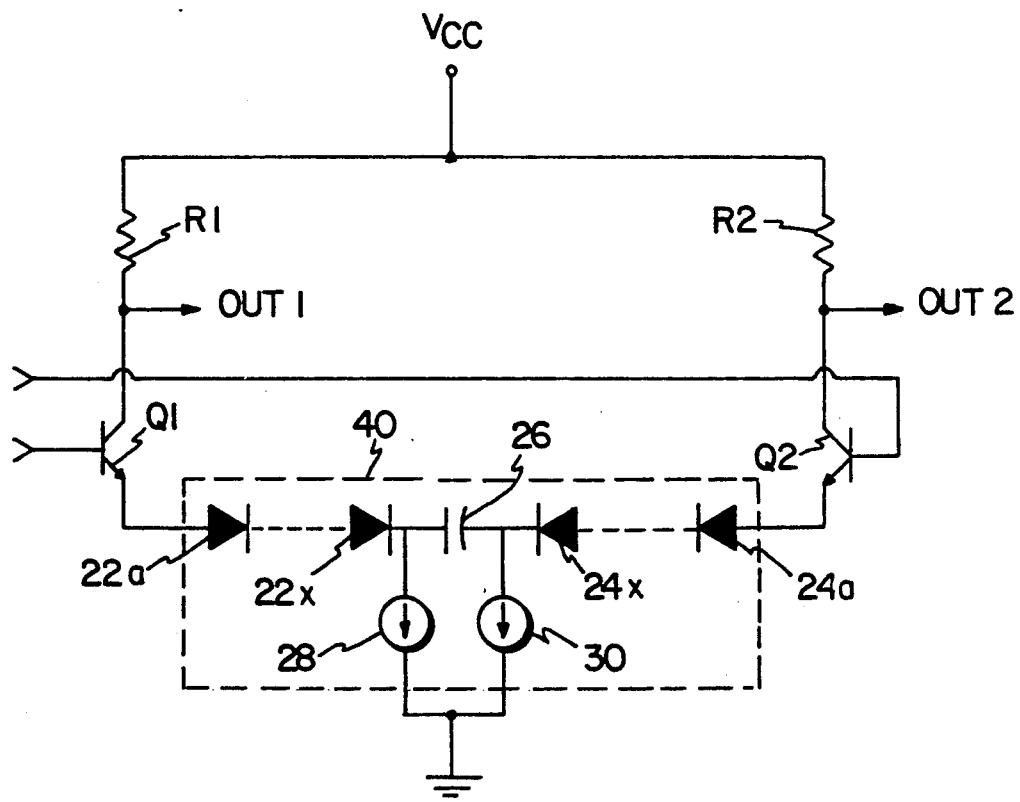
FIG. 4 is a circuit diagram of a modification of the invention illustrated in FIG. 2.

FIG. 4 illustrates a modification of the apparatus illustrated in FIG. 2 wherein the drive current sources I1 and I2 are eliminated and multiple diodes 22a . . . 22x and 24a . . . 24x are employed in place of individual diodes 22 and 24 in FIG. 2. The circuit illustrated in FIG. 4 operates in a manner similar to that described in FIG. 2 except that the bandwidth equation is represented by the following expression:

$$P = \frac{Id}{4\pi X V t C}$$

where X represents the number of diodes of diodes 22 and 24.

Figure 5:
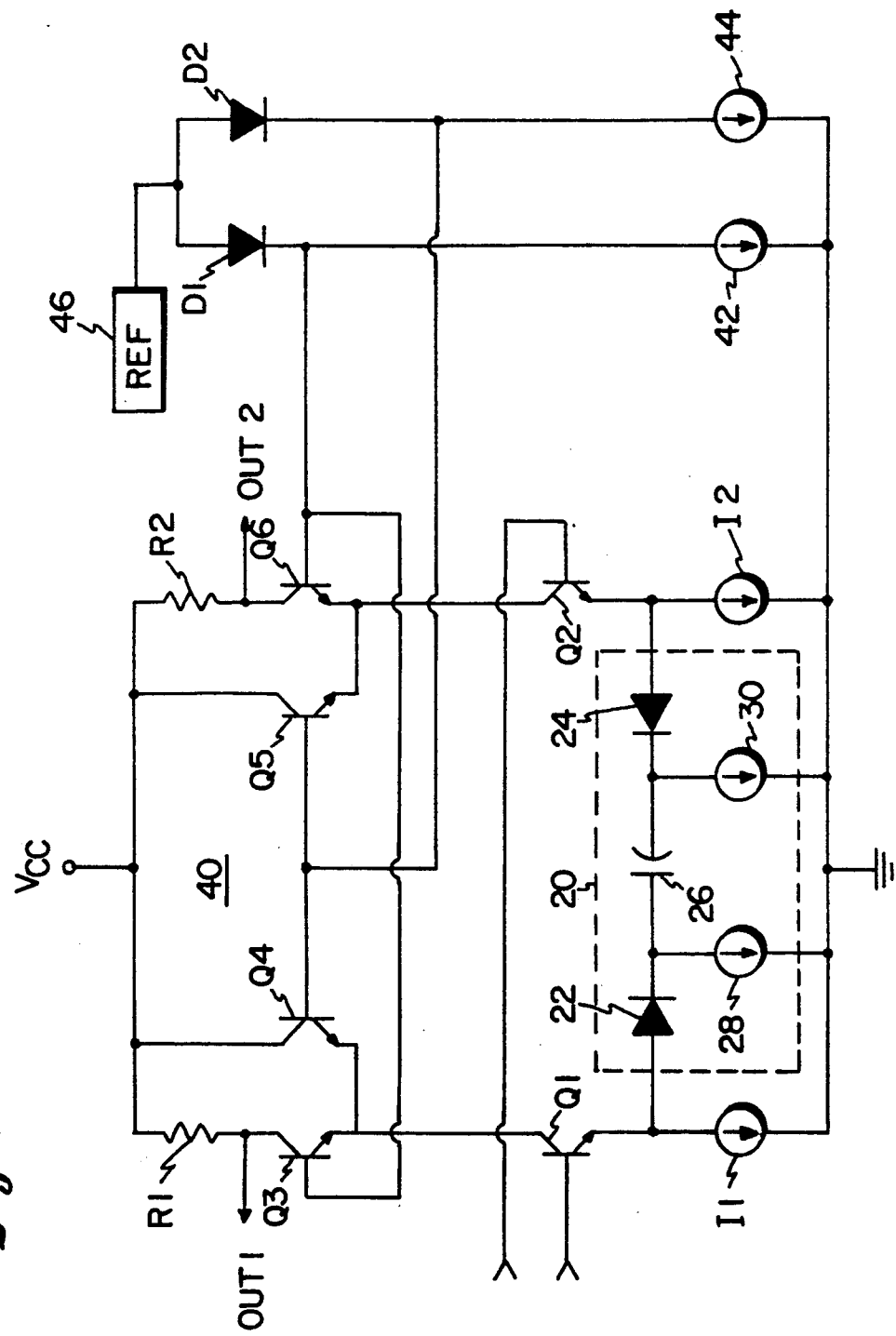
FIG. 5 is a circuit diagram of yet another modification of the circuit illustrated in FIG. 2.

FIG. 5 illustrates a modification of the present invention in which a Gilbert multiplier is employed with the differentiating amplifier for adjusting the voltage gain of the amplifier. To assure a 90 degree phase shift of the differentiator, the gain is nominally set at about 20 dB down from the peak of the gain curve (about one decade below the pole frequency). However, the gain also shifts with a shift in the recovery frequency, which is dependent upon the track position of the head. Hence, a Gilbert multiplier 40 is added to the collector circuits of transistors Q1 and Q2 of the differentiator. The Gilbert multiplier comprises transistors Q3 and Q4 connected to the collector of transistor Q1 and transistors Q5 and Q6 connected to the collector of transistor Q2. Current sources 42 and 44 forward bias diodes D1 and D2 which operate with reference voltage 46 to provide a power source to the transistors of the Gilbert multiplier. Current sources 42 and 44 are derived from the track position using the apparatus illustrated in FIG. 3. Thus, current sources 42 and 44 are similar to current sources 28 and 30.

The present invention thus provides a differentiating amplifier with a variable bandwidth for continuously adjusting the bandwidth of the differentiating amplifier in accordance with track position. The invention comprises a differentiator and variable filter of novel design driven by a current source derived from the disk drive. The apparatus is effective in operation and provides a good frequency response for wide frequency codes.

This invention is not to be limited by the embodiments shown in the drawings and described in the description, which are given by way of example and not of limitation, but only in accordance with the scope of the appended claims.

What is claimed is:

1. A variable bandwidth differentiating amplifier for a disk drive in which information is recorded in concentric tracks, each track having a unique track number, said disk drive having a register containing a track number identifying the individual track from which information is being read, the number in said register being incremented or decremented upon changes of the track being read, said amplifier comprising, in combination;
    a differential amplifier;
    current source means responsive to the track number in said register for generating a bias current having a value uniquely representative of said track number; and
    a variable bandwidth filter operatively connected to said differential amplifier, said filter comprising (i) first diode means connected to one side of said differential amplifier and second diode means connected to the other side of said differential amplifier, the first and second diode means having a resistance value which varies in accordance with the value of said bias current through the first and second diode means, and (ii) a capacitor connected between said first and second diode means;
    said current source means being connected to said first and second diode means, said current source means comprising a first current source connected to the junction of said capacitor and said first diode means to forward bias said first diode means and a second current source connected to the junction of said capacitor and said second diode means to forward bias said second diode means.

2. Apparatus according to claim 1 wherein each of said first and second diode means comprises a plurality of serially connected diodes.

3. Apparatus according to claim 2 further including voltage gain adjustment means for varying the voltage gain of said differential amplifier in response to said track number.

4. Apparatus according to claim 3 wherein said voltage gain adjustment means comprises a Gilbert multiplier connected to said differential amplifier, and additional current source means connected to said Gilbert multiplier, said additional current source means being responsive to said track number in said register for generating a control current for said Gilbert multiplier to maintain relatively constant voltage gain for said differential amplifier.

5. Apparatus according to claim 1 further including voltage gain adjustment means for varying the voltage gain of said differential amplifier in response to said track number.

6. Apparatus according to claim 5 wherein said voltage gain adjustment means comprises a Gilbert multiplier connected to said differential amplifier, and additional current source means connected to said Gilbert multiplier, said additional current source means being responsive to said track number in said register for generating a control current for said Gilbert multiplier to maintain relatively constant voltage gain for sid differential amplifier.

7. A variable bandwidth differentiating amplifier for a disk drive in which information is recorded in concentric tracks, each track having a unique track number, said disk drive having a register containing a track number identifying the individual track from which information is being read, the number in said register being incremented or decremented upon changes of the track being read, said amplifier comprising, in combination;
- a differential amplifier;
- first current source means responsive to the track number in said register for generating a bias current having a value uniquely representative of said track number; and
- a variable bandwidth filter operatively connected to said differential amplifier, said filter comprising (i) semiconductor means having a resistance value which varies in accordance with the value of said bias current through the semiconductor means, and (ii) reactive means connected with said semiconductor means;
- a Gilbert multiplier connected to said differential amplifier for varying the voltage gain of said differential amplifier; and
- second current source means connected to said Gilbert multiplier, said second current source means being responsive to said track number in said register for generating a control current for said Gilbert multiplier to maintain relatively constant voltage gain for said differential amplifier;
- said first current source means being connected to said semiconductor means.

8. Apparatus according to claim 7 wherein said semiconductor means comprises first diode means connected to one side of said differential amplifier and second diode means connected to the other side of said differential amplifier, and said reactive means comprises a capacitor connected between said first and second diode means.

9. Apparatus according to claim 8 wherein each of said first and second diode means comprises a plurality of serially connected diodes.

10. Apparatus according to claim 9 further including voltage gain adjustment means for varying the voltage gain of said differential amplifier in response to said track number.

11. Apparatus according to claim 8 further including voltage gain adjustment means for varying the voltage gain of said differential amplifier in response to said track number.

12. A variable bandwidth differentiating amplifier for a disk drive in which information is recorded in concentric tracks, each track having a unique track number, said disk drive having a register containing a track number identifying the individual track from which information is being read, the number in said register being incremented or decremented upon changes of the track being read, said amplifier comprising, in combination;
- a differential amplifier;
- first current source means responsive to the track number in said register for generating a bias current having a value uniquely representative of said track number;
- a variable bandwidth filter operatively connected to said differential amplifier, said filter comprising (i) semiconductor means having a resistance value which varies in accordance with the value of said bias current through the semiconductor means, and (ii) reactive means connected with said semiconductor means; said first current source means being connected to said semiconductor means;
- a Gilbert multiplier connected to said differential amplifier; and
- second current source means connected to said Gilbert multiplier for generating a control current for said Gilbert multiplier.

13. Apparatus according to claim 12 wherein said second current source means is responsive to said track number in said register for generating said control current at a value uniquely representative of said track number.

14. A variable bandwidth filter for a read recovery circuit of a disk drive in which information is recorded in concentric tracks, each track having a unique track number, said disk drive having a register containing a track number identifying the individual track from which information is being read, the number in said register being incremented or decremented upon changes of the track being read, said filter comprising, in combination;
- (a) current source means responsive to the track number in said register for generating a bias current having a value uniquely representative of said track number;
- (b) first and second diodes having a resistance value which varies in accordance with the value of said bias current to the first and second diodes; and
- (c) a capacitor connected between the first and second diodes;

said current source means comprises a first current source connected to the junction of said capacitor and said first diode to forward bias said first diode and a second current source connected to the junction of said capacitor and said second diode to forward bias said second diode.

* * * * *

UNITED STATES PATENT AND TRADEMARK OFFICE
CERTIFICATE OF CORRECTION

PATENT NO. : 5,157,559

DATED : October 20, 1992

INVENTOR(S) : JEFFREY A. GLEASON, DAVID E. SUTLIFF

It is certified that error appears in the above-identified patent and that said Letters Patent is hereby corrected as shown below:

Title page:

Delete "(75) Inventors: Jefferey A. Gleason, Minneapolis; David E. Sutliff, Eagan, both of Minn.

Insert "(75) Inventors: Jeffrey A. Gleason, Minneapolis; David E. Sutliff, Eagan, both of Minn.

Col. 5, line 8, delete "sid", insert "said"

Signed and Sealed this

Twenty-eighth Day of September, 1993

*Attest:*

BRUCE LEHMAN

*Attesting Officer*        *Commissioner of Patents and Trademarks*